US010725104B2

(12) United States Patent
Kaur et al.

(10) Patent No.: US 10,725,104 B2
(45) Date of Patent: Jul. 28, 2020

(54) SELF TESTING CIRCUIT FOR POWER OPTIMIZATION (71) Applicant: SanDisk Technologies LLC, Plano, TX (US)

(72) Inventors: Amandeep Kaur, Bangalore (IN); Sridhar Yadala, Bangalore (IN); Jayanth Mysore Thimmaiah, Bengaluru (IN); Ravindra Arjun Madpur, Bangalore (IN)

(73) Assignee: SanDisk Technologies LLC, Addison, TX (US)

( * ) Notice: Subject to any disclaimer, the term of this patent is extended or adjusted under 35 U.S.C. 154(b) by 111 days.

(21) Appl. No.: 15/852,407

(22) Filed: Dec. 22, 2017

(65) Prior Publication Data
US 2019/0195948 A1    Jun. 27, 2019

(51) Int. Cl.
*G01R 31/28* (2006.01)
*G01R 31/319* (2006.01)
*G05B 17/02* (2006.01)
*G05B 23/02* (2006.01)
*G11C 29/02* (2006.01)
(Continued)

(52) U.S. Cl.
CPC ... *G01R 31/31917* (2013.01); *G01R 31/3004* (2013.01); *G05B 17/02* (2013.01); *G05B 23/02* (2013.01); *G06F 30/327* (2020.01); *G11C 11/4072* (2013.01); *G11C 29/021* (2013.01); *G11C 29/023* (2013.01); *G11C 29/026* (2013.01); *G11C 29/028* (2013.01);
(Continued)

(58) Field of Classification Search
CPC . G01R 31/31917; G11C 11/4072; G11C 7/20; G11C 29/50012; G11C 29/028; G11C 29/026; G11C 29/08; G11C 29/12; G11C 2029/08; G11C 2029/12; G05B 23/02; G05B 17/02; G06F 17/505
USPC ............... 714/724, 728, 733, 738, 739, 742
See application file for complete search history.

(56) References Cited

U.S. PATENT DOCUMENTS 5,487,018 A * 1/1996 Loos ............... G06F 17/5045
716/102
6,343,352 B1 * 1/2002 Davis ............... G06F 13/1626
365/194
(Continued)

FOREIGN PATENT DOCUMENTS

WO    WO-2013/182872 A1    12/2013

OTHER PUBLICATIONS

Chun, "Automated Frequency Change Hardware for Dynamic Voltage/Frequency Scaling," Feb. 4, 2005, (abstract only).
(Continued)

*Primary Examiner* — Albert Decady
*Assistant Examiner* — Osman M Alshack
(74) *Attorney, Agent, or Firm* — Vierra Magen Marcus LLP (57) ABSTRACT Disclosed is an apparatus including a datapath and a test circuit. The datapath is configured to transfer data between a memory core and an IO interface. The datapath includes a plurality of circuits, and a memory core interface. The plurality of circuits operates according to a supply voltage. The test circuit is coupled to the datapath, and configured to determine, from a set of operable voltage levels of the supply voltage, a first minimum operable voltage level for the datapath to operate for the data traversing the datapath at a first frequency.

7 Claims, 6 Drawing Sheets

(51) Int. Cl.
  *G11C 11/4072* (2006.01)
  *G01R 31/30* (2006.01)
  *G06F 30/327* (2020.01)
  *G11C 29/50* (2006.01)
  *G11C 7/20* (2006.01)
  *G11C 5/14* (2006.01)

(52) U.S. Cl.
  CPC ............... *G11C 5/147* (2013.01); *G11C 7/20* (2013.01); *G11C 29/50012* (2013.01)

(56) References Cited

U.S. PATENT DOCUMENTS

| | | | |
|---|---|---|---|
| 7,053,675 B2 | 5/2006 | Slobodnik et al. | |
| 7,770,034 B2 | 8/2010 | Nanja | |
| 8,127,157 B2 | 2/2012 | Bilak | |
| 2006/0005092 A1* | 1/2006 | Frodsham | G06F 11/27 714/734 |
| 2006/0107154 A1* | 5/2006 | Bansal | G01R 31/31716 714/738 |
| 2008/0238494 A1 | 10/2008 | Ortiz et al. | |
| 2009/0016140 A1* | 1/2009 | Qureshi | G11C 5/147 365/227 |
| 2009/0043955 A1* | 2/2009 | Butt | G11C 7/1051 711/105 |
| 2012/0327726 A1* | 12/2012 | Tsern | G11C 11/4074 365/189.11 |
| 2013/0057240 A1* | 3/2013 | Zambetti | H02M 3/156 323/271 |
| 2014/0317460 A1 | 10/2014 | Kleveland et al. | |
| 2015/0055405 A1* | 2/2015 | Shiratake | G11C 11/1697 365/158 |
| 2015/0249428 A1 | 9/2015 | Huynh et al. | |
| 2019/0122282 A1* | 4/2019 | Klein | G06F 17/50 |

OTHER PUBLICATIONS

Lee, et al., "On-the-fly dynamic voltage scaling (DVS) in 65nm energy-efficient power management with frequency-based control (FBC) for SoC system," IEEE Asian Solid-State Circuits Conference, Nov. 14, 2011, pp. 329-332.

Martonosi, et al., "Efficient behavior-driven runtime dynamic voltage scaling policies," Third IEEE/ACM/IFIP, Jan. 29, 2007, pp. 105-110.

Tailong, et al., "A DFT Solution for Multi-Supply Multi-Voltage System-on-Chip," Information Engineering and Computer Science (ICIECS), Dec. 30, 2010, 3 pages.

* cited by examiner

SELF TESTING CIRCUIT FOR POWER OPTIMIZATION

BACKGROUND

The following description is provided to assist the understanding of the reader. None of the information provided is admitted to be prior art.

Recent memory devices support operations in different frequencies. For example, a memory device is operable at a high frequency (e.g., 1 GHz) for allowing data storage and data read at a fast data rate, and operable at a low frequency (e.g., 533 MHz) lower than the high frequency for allowing data storage and data read at a low data rate lower than the fast data rate. By supporting different operation modes, the memory device can be integrated with different computing devices or dynamically reconfigured.

Memory devices supporting different operation modes may not operate in a power efficient manner. Generally, a memory device operating at a higher frequency consumes more power than at a lower frequency. To ensure correct operations of the memory device, a supply voltage (also referred to as a "power supply voltage" herein) enabling the memory device to operate at the higher frequency is supplied to the memory device. The memory device operating at the supply voltage supporting the high frequency operation is also operable at the lower frequency. However, the memory device operating at the lower frequency with the supply voltage to support the higher frequency operation may not be power/energy efficient.

SUMMARY

Various embodiments are related to an apparatus with a test circuit. The apparatus includes a datapath to transfer data between a memory core and an IO interface. The datapath includes a plurality of circuits and a memory core interface. The plurality of circuits operates according to a supply voltage. The test circuit is coupled to the datapath. The test circuit is configured to determine, from a set of operable voltage levels of the supply voltage, a first minimum operable voltage level for the datapath to operate for the data traversing the datapath at a first frequency.

In one or more embodiments, the test circuit is configured to determine, from the set of operable voltage levels of the supply voltage, a second minimum operable voltage level for the datapath to operate for the data traversing the datapath at a second frequency.

In one or more embodiments, the apparatus further includes a storage device configured to, store, for each of a set of frequencies, a corresponding minimum operable voltage level for the datapath to operate for the data traversing the datapath at the each of the set of frequencies. The apparatus may further include a state machine coupled to the datapath. The state machine may be configured to detect, a frequency of input data received at the datapath. The state machine may be further configured to retrieve, from the storage device, a corresponding minimum operable voltage level associated with the frequency of the input data. The state machine may configure a voltage supply circuit to generate the supply voltage at the retrieved minimum operable voltage level.

In one or more embodiments, the test circuit includes a state machine configured to select a frequency from a set of frequencies, select a voltage level from the set of operable voltage levels, and configure the voltage supply circuit to generate the supply voltage at the selected voltage level. The test circuit may further include a reconfigurable clock circuit coupled to the state machine. The reconfigurable clock circuit may be configured to generate a clock signal at the selected frequency. The test circuit may further include a test data generator coupled to the state machine. The test data generator may be configured to propagate test data through the datapath according to the clock signal. The test circuit may further include a comparator coupled to the state machine and the test data generator. The comparator may be configured to receive the test data from the test data generator, receive the propagated test data from the datapath, and compare the test data from the test data generator and the propagated test data from the datapath to determine whether the datapath is operable at the selected frequency for the selected voltage level.

In one or more embodiments, the test data is random data.

In one or more embodiments, the comparator is configured to determine that the datapath is inoperable at the selected frequency for the selected voltage level, in response to determining that the test data from the test data generator and the propagated test data from the datapath are not matching. In one or more embodiments, the comparator is configured to determine that the datapath is operable at the selected frequency for the selected voltage level, in response to determining that the test data from the test data generator and the propagated test data from the datapath are matching.

In one or more embodiments, in response to determining that the datapath is inoperable at the selected frequency for the selected voltage level, the state machine is configured to: select another voltage level higher than the selected voltage level, and configure the voltage supply circuit to generate the supply voltage at the another voltage level. The comparator may be configured to determine whether the datapath is operable at the selected frequency for the another voltage level. In response to determining that the datapath is operable at the selected frequency for the another voltage level, the state machine may be configured to determine that the another voltage level is a minimum operable voltage level for the datapath to operate for the data traversing the datapath at the selected frequency.

In one or more embodiments, in response to determining that the datapath is operable at the selected frequency for the selected voltage level, the state machine is configured to: select another voltage level lower than the selected voltage level, and configure the voltage supply circuit to generate the supply voltage at the another voltage level. The comparator may be configured to determine whether the datapath is operable at the selected frequency for the another voltage level. In response to determining that the datapath is inoperable at the selected frequency for the another voltage level, the state machine may be configured to determine that the selected voltage level is a minimum operable voltage level, at which the datapath is operable for the data traversing the datapath at the selected frequency.

Various embodiments disclosed herein are related to a system including a voltage supply circuit to generate a supply voltage. The system further includes a datapath to transfer data between a memory core and an IO interface. The datapath includes a plurality of circuits and a memory core interface. The plurality of circuits operates according to the supply voltage. The system further includes a storage configured to store a first minimum operable voltage level, from a set of operable voltage levels of the supply voltage, associated with a first frequency. The datapath is operable at the first minimum operable voltage level for the data traversing the datapath at the first frequency. The storage is further configured to store a second minimum operable voltage level, from the set of operable voltage levels of the supply voltage, associated with a second frequency. The datapath is operable at the second minimum operable voltage level for the data traversing the datapath at the second frequency.

In one or more embodiments, the datapath is inoperable for a voltage level lower than the first minimum operable voltage level for the data traversing the datapath at the first frequency, and is inoperable for another voltage level lower than the second minimum operable voltage level for the data traversing the datapath at the second frequency.

In one or more embodiments, the system further includes a state machine configured to detect a frequency of input data received at the datapath, retrieve, from the storage, a corresponding minimum operable voltage level associated with the frequency of the input data, and configure the voltage supply circuit to generate the supply voltage at the retrieved minimum operable voltage level.

Various embodiments disclosed herein are related to a method including determining a frequency of input data received at a datapath between a memory core and an IO interface. The method further includes retrieving a minimum operable voltage level associated with the frequency of the input data from a set of operable voltage levels of a supply voltage. The method further includes supplying, to the datapath, the supply voltage at the retrieved minimum operable voltage level.

In one or more embodiments, the method further includes determining, for each frequency of the data traversing the datapath, corresponding minimum operable voltage level. Determining, for the each frequency of the data traversing the datapath, the corresponding minimum operable voltage level may include selecting a voltage level for the set of operable voltage levels of the supply voltage, propagating, by a test data generator, test data through the datapath at the frequency, and comparing the test data from the test data generator and the propagated test data from the datapath to determine whether the datapath is operable at the frequency for the selected voltage level.

In one or more embodiments, determining, for the each frequency of the data traversing the datapath, the corresponding minimum operable voltage level further includes determining that the datapath is inoperable at the frequency for the selected voltage level, in response to determining that the test data from the test data generator and the propagated test data from the datapath are not matching, and determining that the datapath is operable at the frequency for the selected voltage level, in response to determining that the test data from the test data generator and the propagated test data from the datapath are matching.

In one or more embodiments, determining, for the each frequency of the data traversing the datapath, the corresponding minimum operable voltage level further includes, in response to determining that the datapath is inoperable at the frequency for the selected voltage level, selecting another voltage level of the supply voltage applied to the datapath, the another voltage level higher than the selected voltage level, determining whether the datapath is operable at the frequency for the another voltage level, and determining that the another voltage level is the corresponding minimum operable voltage level associated with the frequency, in response to determining that the datapath is operable at the frequency for the another voltage level.

In one or more embodiments, determining, for the each frequency of the data traversing the datapath, the corresponding minimum operable voltage level further includes, in response to determining that the datapath is operable at the frequency for the selected voltage level, selecting another voltage level of the supply voltage applied to the datapath, the another voltage level lower than the selected voltage level, determining whether the datapath is operable at the frequency for the another voltage level, and determining that the selected voltage level is the corresponding minimum operable voltage level associated with the frequency, in response to determining that the datapath is inoperable at the frequency for the another voltage level.

Various embodiments disclosed herein are related to a system including means for determining a frequency of input data received at a datapath between a memory core and an IO interface, means for retrieving a minimum operable voltage level associated with the frequency of the input data from a set of operable voltage levels of a supply voltage, and means for supplying, to the datapath, the supply voltage at the retrieved minimum operable voltage level.

The foregoing summary is illustrative and is not intended to be in any way limiting. In addition to the illustrative aspects, embodiments, and features described above, further aspects, embodiments, and features will become apparent by reference to the following drawings and the detailed description.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Various embodiments disclosed herein are related to a device including a built-in-test circuit for automatically determining voltage levels of a power supply for different frequencies. In one or more embodiments, the device is operable at least at either a first frequency or a second frequency lower than the first frequency. The built-in-test circuit automatically determines, from a set of operable voltage levels of the power supply, a first minimum operable voltage level at which the device is operable at the first frequency. In addition, the built-in-test circuit automatically determines, from the set of operable voltage levels, a second minimum operable voltage level at which the device is operable at the second frequency. The device stores the first minimum operable voltage level for the first frequency and the second minimum operable voltage level for the second frequency. When the device is in operation, the device may automatically detect an operating frequency and configure the power supply to provide power at a corresponding minimum operable voltage level stored. For example, if the device is operating at the first frequency, the power supply is configured according to the first minimum operable voltage level. However, if the device is operating at the second frequency, the power supply is configured according to the corresponding second minimum operable voltage level. Accordingly, the device can be operated in a manner that increases its power efficiency at multiple operational frequencies.

Figure 1:
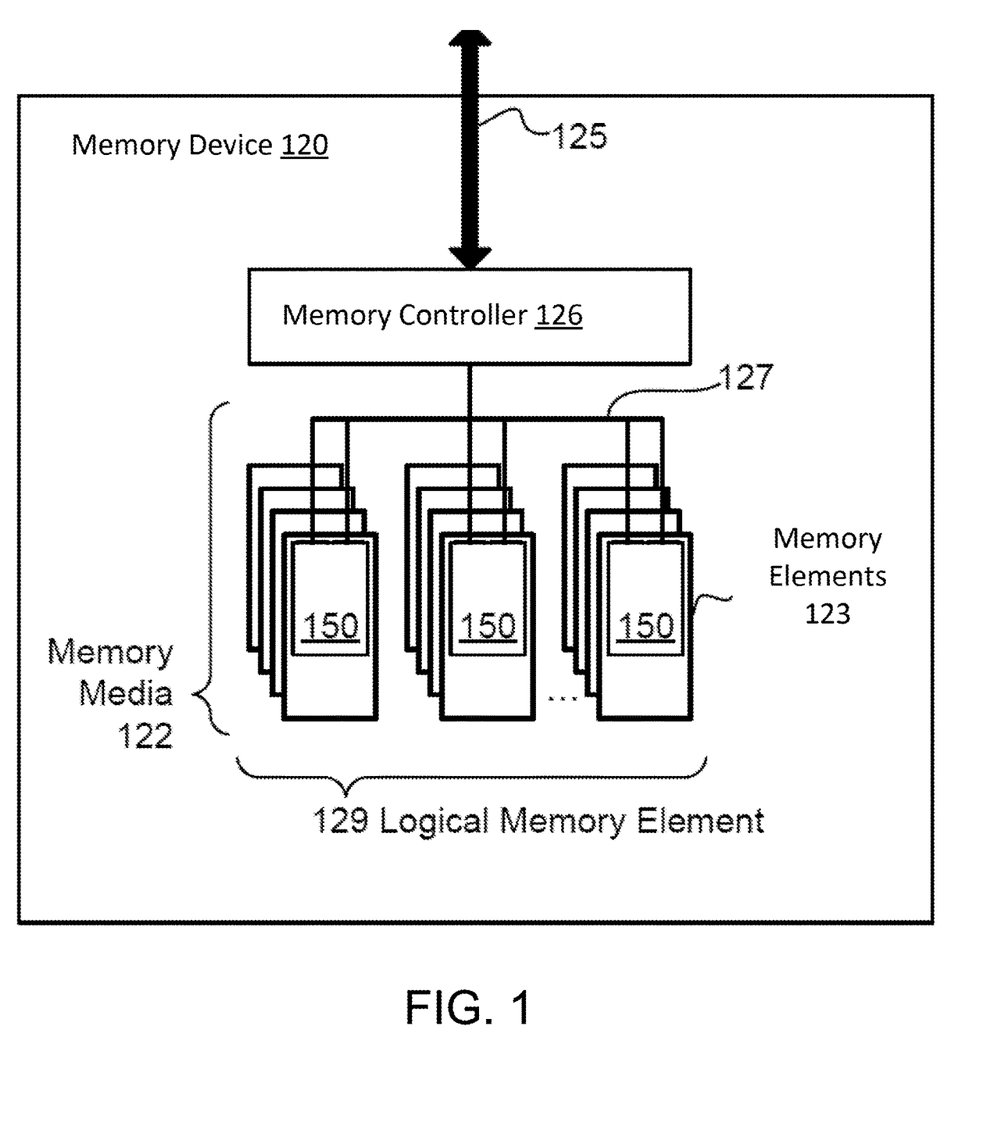
FIG. 1 is a block diagram of a memory device according to an example embodiment.

FIG. 1 is a block diagram of one embodiment of a memory device 120. The memory device 120, in various embodiments, may be disposed in a computing device. In one embodiment, the memory device 120 includes one or more memory elements 123, such as semiconductor chips or packages or other integrated circuit devices disposed on one or more printed circuit boards, storage housings, and/or other mechanical and/or electrical support structures. For example, the memory device 120 may include one or more direct inline memory module (DIMM) cards, one or more expansion cards and/or daughter cards, a solid-state-drive (SSD) or other hard drive device, and/or may have another memory and/or storage form factor. The memory device 120 may be integrated with and/or mounted on a motherboard of the computing device, installed in a port and/or slot of the computing device, installed on a different computing device and/or a dedicated storage appliance on a network, in communication with the computing device over an external bus (e.g., an external hard drive), or the like.

The memory device(s) 120 may include recording, memory, and/or storage devices, such as solid-state storage devices, semiconductor storage devices, and or other known storage devices that are arranged and/or partitioned into a plurality of addressable media storage locations. As used herein, a media storage location refers to any physical unit of memory (e.g., any quantity of physical storage media on a memory device 120). Memory units may include, but are not limited to: pages, memory divisions, blocks, sectors, collections or sets of physical storage locations (e.g., logical pages, logical blocks), or the like.

The memory device 120 may include one or more elements 123 of memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of memory media 122, in certain embodiments, include storage class memory (SCM).

While the memory media 122 is referred to herein as "memory media," in various embodiments, the memory media 122 may more generally include one or more recording media capable of recording data, which may be referred to as a memory medium, a storage medium, or the like.

The memory media 122 may include one or more memory elements 123, which may include, but are not limited to: chips, packages, planes, die, or the like. A memory media controller 126 may be configured to manage data operations on the memory media 122, and may include one or more processors, programmable processors (e.g., FPGAs), ASICs, micro-controllers, or the like. In some embodiments, the memory media controller 126 is configured to store data on and/or read data from the memory media 122, to transfer data to/from the memory device 120.

In various embodiments, the memory device 120 includes a memory media controller 126 coupled to interface components 150 of the memory elements 123 and an external device (not shown). The memory device 120 may be communicatively coupled to the external device (e.g., a host processor or other external computing device) through a bus 125, and coupled to the interface components 150 through a bus 127. In this configuration, the memory device 120 receives a request to write or read data from the external device through the bus 125, and manages one or more memory devices 120 and/or memory elements 123 to execute the request.

In some embodiments, the bus 127 may communicatively couple the memory elements 123 to the memory media controller 126 in parallel. This parallel access may allow the memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the memory elements.

Figure 2:
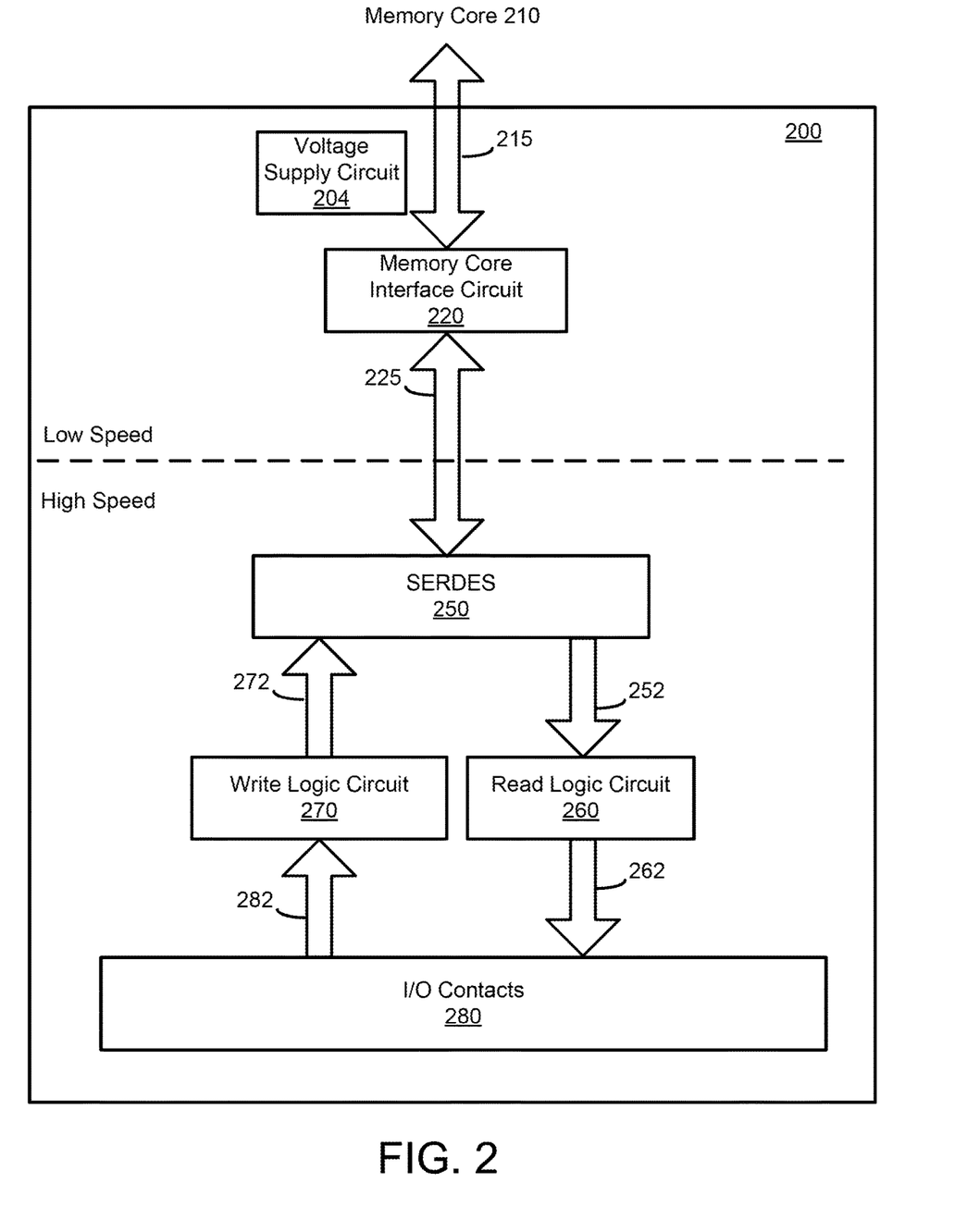
FIG. 2 is a circuit representation of a datapath of a memory die of the memory system according to an example embodiment.

Referring FIG. 2, illustrated is a circuit representation of a datapath 200 of a memory die of the memory system. In one embodiment, the datapath 200 is part of the interface component 150 of FIG. 1. Specifically, the datapath 200 may be any interface circuitry between the memory media controller 126 and memory core 210. The memory core 210 may be any memory component that stores data. In one embodiment, the memory core 210 includes a plurality of memory cells. Such memory cells may be of any type of memory known in the art including, but not limited to, ReRAM, Memristor memory, programmable metallization cell memory, phase-change memory (PCM, PCME, PRAM, PCRAM, ovonic unified memory, chalcogenide RAM, or C-RAM), NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. In one implementation, the datapath 200 receives serial data (e.g., N bits) for writing data from the memory media controller 126, and converts the serial data into parallel data (e.g., L bits) for storing at the memory core 210. In addition, the datapath 200 receives parallel data (e.g., L bits) for reading data stored by the memory core 210, and converts the parallel data into serial data (e.g., N bits) for transmission to the memory media controller 126. The number of bits of the parallel data may be larger than the number of bits of the serial data. The datapath 200 may be embodied on a same die with the memory core 210 as a single memory element 123. In one embodiment, the datapath 200 includes a memory core interface circuit 220, a serializer/deserializer (SERDES) converter 250, a read logic circuit 260, a write logic circuit 270, input/output (I/O) contacts 280, and a voltage supply circuit 204. These components operate together to exchange data between the memory media controller 126 and the memory core 210. The datapath 200 may include more, fewer, or additional components than shown in FIG. 2.

In one configuration, a signal propagates from the I/O contacts 280 to the memory core 210 for performing a write operation. In one approach, the I/O contacts 280 receive data for writing. The write logic circuit 270 may perform digital logic processing (e.g., multiplexing, latching, etc.) on the signal received at the I/O contacts 280, and forward the processed data to the SERDES converter 250. The SERDES 250 converts serial data (e.g., high speed) into parallel data (e.g., low speed), and the memory core interface circuit 220 forwards the parallel data for writing to the memory core 210.

Conversely, a signal propagates from the memory core 210 to the I/O contacts 280 for performing read operation. In one approach, memory core interface circuit 220 receives parallel data for read from the memory core 210. The SERDES 250 may convert the parallel data (e.g., low speed) for read from the memory core interface circuit 220 into serial data (e.g., high speed) for read, and forward the serial data for read to the read logic circuit 260. The read logic circuit 260 may perform digital logic processing (e.g., multiplexing, latching, etc.) on the serial data, and output the processed signals to corresponding I/O contacts 280.

In one configuration, the I/O contacts 280 form an IO interface coupled to the memory media controller 126 through the bus 127. The IO interface may be any circuit or components that form an interface across which input/output signals may be transmitted. In some embodiments, the I/O contacts 280 are coupled to the write logic circuit 270 through a connection 282, and the read logic circuit 260 through a connection 262. The connections 262, 282 are electrical connectors. The connections 262, 282 may each be N bit bus or N bit conductive traces/wires. The I/O contacts 280 are conductive contacts enabling the datapath 200 to receive electrical signals from or transmit electrical signals to the memory media controller 126 through the bus 127. Examples of the I/O contacts 280 include contacts for input and output data, read clock RE, write clock DQS, chip enable, etc. In this configuration, the signals received at the I/O contacts 280 can be forwarded to the write logic circuit 270, and signals from the read logic circuit 260 can be forwarded to the memory media controller 126.

The write logic circuit 270 is a circuit component that forwards data to be written to the SERDES converter 250. In some embodiments, the write logic circuit 270 is coupled to the I/O contacts through the connection 282 and connected to the SERDES converter 250 through the connection 272. The connection 272 is an electrical connector. The connection 272 may be M bit bus or M bit conductive traces/wires. The write logic circuit 270 may include a multiplexer, a latch, or other digital logic circuitries for outputting a serial data for writing to the SERDES converter 250. In this configuration, the write logic circuit 270 latches signals from a plurality of contacts of the I/O contacts 280, and multiplexes the latched signals at the plurality of contacts to output the serial data for writing to the SERDES converter 250 through the connection 272. The write logic circuit 270 may convert N number of signals from the I/O contacts 280 into M number of signals larger than the N number of signals to relax setup/hold time requirement of the SERDES 250.

The read logic circuit 260 is a circuit component that forwards data to be read to the I/O contacts 280. In some embodiments, the read logic circuit 260 is coupled to the I/O contacts through the connection 262 and connected to the SERDES converter 250 through the connection 252. The connection 252 is an electrical connector that permits transmission of electrical signals between components. As an example, the connection 252 may be an M bit bus or M bit conductive traces/wires. The read logic circuit 260 may include a multiplexer, a latch, or other digital logic circuitries for outputting a serial data for reading to the I/O contacts 280. In this configuration, the read logic circuit 260 latches signals from the SERDES converter 250, and multiplexes the latched signals to output the serial data for reading to the I/O contacts 280 through the connection 262. The read logic circuit 260 may convert M number of signals from the read logic circuit 260 into N number of signals less than the M number of signals.

The SERDES converter 250 is a component that converts serial data to parallel data, and parallel data to serial data. In some embodiments, the SERDES converter is coupled to the write logic circuit 270 through the connection 272, the read logic circuit 260 through the connection 252, and the memory core interface circuit 220 through the connection 225. The connection 225 is an electrical connector. The connection 225 may be L bit bus or L bit conductive traces/wires. In this configuration, the SERDES converter 250 receives the serial data (e.g., M bits) for writing from the write logic circuit 270 through the connection 272, deserializes the serial data into parallel data (e.g., L bits) for writing, and provides the parallel data to the memory core interface circuit 220 through the connection 225. In addition, the SERDES converter 250 receives parallel data (e.g., L bits) for reading from the memory core interface circuit 220 through the connection 225, serializes the parallel data into serial data (e.g., M bits) for reading, and provides the serial data to the read logic circuit 260 through the connection 252.

Memory core interface circuit 220 may be any circuit component that interfaces between the memory core 210 and the SERDES converter 250. In one embodiment, the memory core interface circuit 220 is implemented as a first in/first out (FIFO) buffer. In some embodiments, the memory core interface circuit 220 is coupled to the SERDES converter 250 through the connection 225, and is coupled to the memory core 210 through the connection 215. The connection 215 is an electrical connector. The connection 215 may be L bit bus or L bit conductive traces/wires. In this configuration, the memory core interface circuit 220 receives data for writing from the SERDES converter 250 through the connection 225, and transmits the received data to the memory core 210 through the connection 215. Moreover, the memory core interface circuit 220 receives data for reading from the memory core 210 through the connection 215, and transmits the received data to the SERDES converter 250 through the connection 225.

In one aspect, a signal represented in a parallel form (e.g., L bits) allows circuits to operate at a lower frequency than the same signal represented in a serial form (e.g., N bits). For example, the memory core interface circuit 220 operates at a lower frequency than the SERDES converter 250, the write logic circuit 270, and the read logic circuit 260. Accordingly, setup/hold time requirement of the memory core interface circuit 220 can be relaxed.

The voltage supply circuit 204 may be any component that distributes power to the circuits of the datapath 200. In one aspect, the voltage supply circuit 204 is digitally controlled to output a supply voltage VDD selected from a set of operable voltage levels. The operable voltage levels may be any voltage levels of the supply voltage VDD at which the circuits of the datapath 200 are functional. For example, the supply voltage VDD may be selected from a set of 0.8, 0.9, 1.0, 1.1, 1.2 volts (V). Supplying a higher supply voltage VDD to the circuits in the datapath 200 enables the circuits to operate at a higher frequency which may increase speed and performance of the circuits, but renders higher power consumption. Assuming for an example that the datapath 200 correctly operates at a frequency of 533 MHz of the serial data at the I/O contacts 280 with a supply voltage of 0.8V, but one of the circuits (e.g., SERDES converter 250) of the datapath 200 does not work properly at a frequency of 1.066 GHz with a supply voltage of 0.8V. Further continuing with the example above, the one of the circuits (e.g., SERDES converter 250) works properly at the frequency of 1.066 GHz with the supply voltage of 1.0V. In this example, setting the supply voltage of 1.0V ensures the datapath 200 to correctly operate at both 1.066 GHz and 533 MHz. However, setting the supply voltage of 1.0V even at the frequency of 533 MHz causes inefficient power consumption. Specifically, the datapath 200 operating with a supply voltage with 1.0V at a frequency of 533 MHz renders 56% more power consumption than the datapath 200 operating with the supply voltage of 0.8V at a frequency of 533 MHz.

Figure 3A:
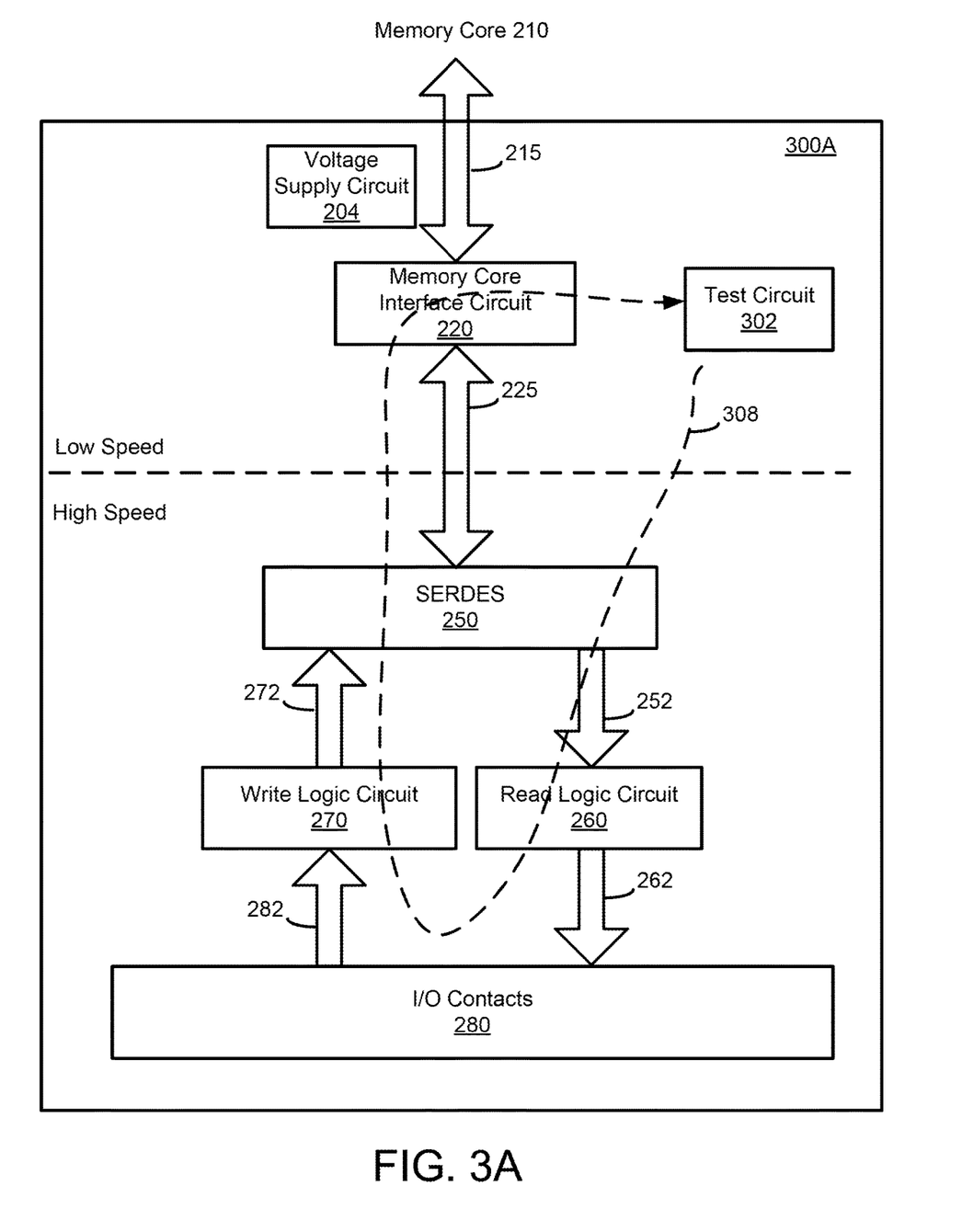
FIG. 3A is a circuit representation of a datapath of a memory die of the memory system with a built-in test circuitry according to an example embodiment.

Referring to FIG. 3A, illustrated is, one embodiment of, a circuit representation of another datapath 300A of a memory die of the memory system with a test circuit 302. The datapath 300A is substantially similar to the datapath 200 of FIG. 2, except the test circuit 302 is added. Detailed description of duplicative portions is omitted herein for the sake of brevity.

The test circuit 302 may be any circuit that performs testing to automatically determine, for different operating frequencies, corresponding minimum operable voltages from a set of operable voltages of the voltage supply circuit 204. A minimum operable voltage for an operating frequency may be a lowest voltage from a set of operable voltages of the voltage supply circuit 204 at which the circuits associated with the datapath 300 are operable. In other embodiments, the minimum operable voltage may be any voltages that are lower than other operable voltages of the voltage supply circuit 204. The test circuit 302 may be any circuit capable of testing operation of the datapath 300 at different operating frequencies and/or supply voltages. In one embodiment, the test circuit 302 may be a built-in-test circuit embodied on a same die or a same chip as the circuitries of the datapath 300. In other embodiments, the test circuit 302 may be an external test circuit embodied on a separate die or a separate chip as the circuitries of the datapath 300. The external test circuit may be connected to test pins or connectors of the datapath 300 to perform testing. In one aspect, the test circuit 302 receives an instruction to perform the built-in-testing from the memory media controller 126 through the bus 127. The memory media controller 126 may generate the instruction to initiate the built-in-testing during a die sort process to test functionalities of different dies before deployment, in between usage (e.g., reading and writing) after deployment, or periodically. In response to the instruction, the test circuit 302 test functionality of different voltage levels of the operable voltage levels of the voltage supply circuit 204 at different operating frequencies of the datapath 300A.

In one embodiment, the test circuit 302 propagates test data through a path 308 of the datapath 300A to test functionality of the datapath 300A. The test circuit 302 selects a supply voltage level of the voltage supply circuit 204 and a frequency of operation of the datapath 300A. In addition, the test circuit 302 generates test data (e.g., predetermined data or random data) at the selected frequency, and propagates the test data through the path 308 of the datapath 300A. The path 308 may include the SERDES converter 250, the read logic circuit 260, the write logic circuit 270, the SERDES converter 250, and the memory core interface circuit 220 in that sequence. The test circuit 302 compares the propagated data with the test data, and determines whether the datapath 300A is functional with the selected supply voltage level at the selected frequency based on the comparison. For example, the test circuit 302 determines that the datapath 300A is functional with the selected supply voltage level at the selected frequency, if the propagated test data match the test data. Conversely, the test circuit 302 determines that the datapath 300A is not functional with the selected supply voltage level at the selected frequency, if the propagated test data do not match the test data. Detailed examples of the implementation and operation of the test circuit 302 are provided below with respect to FIGS. 3B and 4.

The test circuit 302 allows the datapath 300A to operate in power efficient manner for different frequencies. In one approach, the test circuit 302 stores, for different operating frequencies, corresponding minimum operable voltage levels from a set of operable voltages of the voltage supply circuit 204. When the datapath 300A in use for read/write operation, the test circuit 302 may automatically determine a frequency of a signal at the I/O contacts 280, and determines a minimum operable voltage level corresponding to the frequency. Moreover, the test circuit 302 causes the voltage supply circuit 204 to operate according to the minimum operable voltage level associated with the frequency. Hence, the datapath 300A can be configured to operate in a power efficient manner for any operating frequency.

Figure 3B:
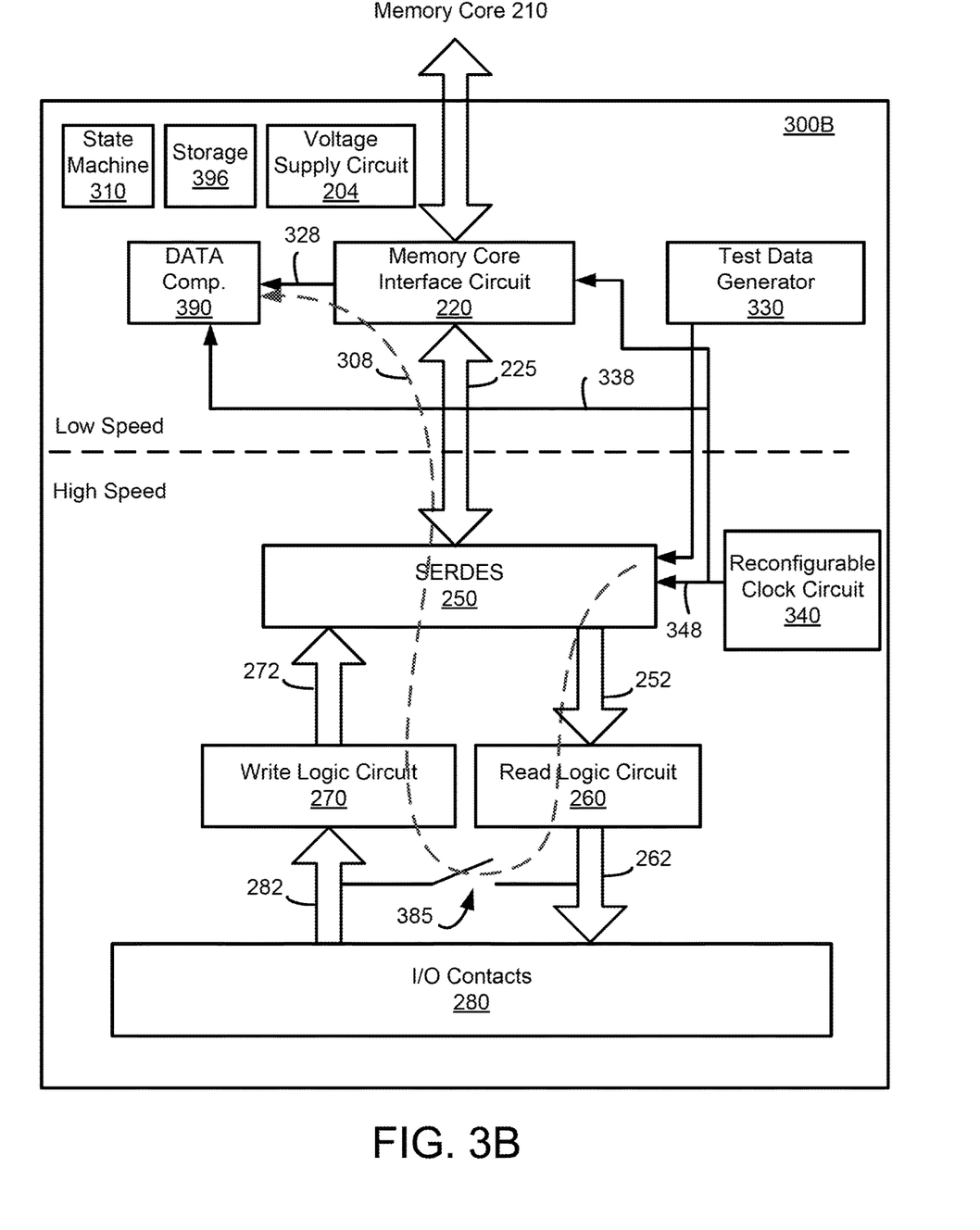
FIG. 3B is a circuit representation of a datapath of a memory die of the memory system with a built-in test circuitry according to an example embodiment.

Referring to FIG. 3B, illustrated is a circuit representation of another datapath 300B of a memory die of the memory system with one embodiment of a built-in-test circuitry. The datapath 300B is substantially equal to the datapath 200 of FIG. 2, except a state machine 310, a data comparator 390, a test data generator 330, a reconfigurable clock circuit 340, storage 396, and a switch 385 are added. Detailed description of duplicative portions is omitted herein for the sake of brevity. In one aspect, the state machine 310, data comparator 390, test data generator 330, reconfigurable clock circuit 340, storage 396, and switch 385 constitute a test circuit 302. These components operate together to perform testing to automatically find, for different operating frequencies, corresponding minimum operable voltages, at which the datapath 300B is operable.

The test data generator 330 may be any circuit that generates test data for performing built-in-testing. In one embodiment, the test data generator 330 is coupled to the SERDES converter 250 and the data comparator 390 through a connection 338. In this configuration, the test data generator 330 generates test data and provides the test data to the SERDES converter 250 and the data comparator 390. The test data generator 330 generates a predetermined waveform or random data as test data.

The reconfigurable clock circuit 340 may be any circuit that generates a clock signal. In one embodiment, the reconfigurable clock circuit 340 may be a variable oscillator that is coupled to the SERDES converter 250 and the memory core interface circuit 220 through the connection 348. In this configuration, the reconfigurable clock circuit 340 provides the clock signal to the SERDES converter 250 and the memory core interface circuit 220. In one aspect, the frequency of the reconfigurable clock circuit 340 is configured according to a control from the state machine 310. For example, the oscillator can output a clock signal at a selected frequency from a set of frequencies (e.g., 533 MHz, 800 MHz, 1.066 GHz, etc.).

The switch 385 may be any circuit that shorts an input to the write logic circuit 270 and the output of the read logic circuit 260 during built-in-testing. In one embodiment, the switch 385 is embodied as a transistor coupled between the connection 282 and the connection 262. Alternatively, the switch 385 may be implemented as a multiplexer, tristate buffer, etc. connected to the write logic circuit 270, the read logic circuit 260, and the I/O contacts 280. The switch 385 may electrically couple the connection 282 to the connection 262 or electrically decouple the connection 282 to the connection 262, in response to a command from the state machine 310.

The data comparator 390 may be any circuit that compares propagated test data with reference data. In one embodiment, the data comparator 390 is coupled to the test data generator 330 through the connection 338 to receive the test data as the reference data. In addition, the data comparator 390 is coupled to the memory core interface circuit 220 through the connection 328 to receive output of the memory core interface circuit 220 to retrieve propagated test data propagated through the datapath 300B. By comparing the output of the test data generator 330 and data traveled through the datapath 300B, the data comparator 390 can determine whether the datapath 300B operates correctly with a supply voltage from the voltage supply circuit 204 at a particular frequency.

The state machine 310 may be any circuit that controls operations of the test data generator 330, the reconfigurable clock circuit 340, the data comparator 390, the voltage supply circuit 204 and the storage 396 for performing built-in-testing. The state machine 310 may initiate the built-in-testing upon receiving an instruction to perform the built-in-testing from the memory media controller 126. In one aspect, the state machine 310 tests functionalities of datapath 300B with a supply voltage of the voltage supply circuit 204 at a particular frequency. If the datapath 300B is functional with the supply voltage at the particular frequency, the state machine 310 may repeat decreasing a supply voltage and testing the functionality of the datapath 300B at the particular frequency, until the datapath 300B is not functional. If the datapath 300B is not functional with the supply voltage at the particular frequency, the state machine 310 may repeat increasing a supply voltage and testing the functionality of the datapath 300B at the particular frequency, until the datapath 300B is functional. The state machine stores, from the set of operable voltage levels of the voltage supply circuit 204, the minimum operable voltage with which the datapath 300B is functional at the particular frequency. If the datapath 300B is functional for all voltage levels of voltage supply circuit 204 at the particular frequency, the state machine 310 may repeat the test at a higher frequency. If the datapath 300B is not functional for all voltage levels of voltage supply circuit 204 at the particular frequency, the state machine 310 may repeat the test at a lower frequency. Additional description of performing built-in-testing is provided below with respect to FIG. 4.

The storage 396 may be any circuit, at which the state machine 310 stores, for different frequencies, minimum supply voltages from a set of operable voltage levels of the voltage supply circuit 204. In one aspect, the storage 396 is a means for storing, for each frequency of data traversing a datapath 300B between a memory core (e.g., memory core 210 or any other form of memory known in the art) and the 10 contacts 280, from a set of operable voltage levels of a supply voltage of the voltage supply circuit 204, a corresponding minimum operable voltage level for the datapath 300B to operate for the data traversing the datapath 300B at the frequency. For example, the storage 396 stores the datapath 300B is operable with a supply voltage of 0.8V at 533 MHz and 1.0V at 1.066 GHz. In one implementation, the storage 396 stores the minimum supply voltages for the different frequencies in a form of look up table.

In one approach, during the built-in-testing, the state machine 310 selects a frequency of the reconfigurable clock circuit 340 and selects a voltage of a supply voltage of the voltage supply circuit 204. During the built-in-testing, the SERDES converter 250 latches the test data from the test data generator 330 according to timing information of the clock signal from the reconfigurable clock circuit 340, and transmits the latched test data to the read logic circuit 260. In addition, during the built-in-testing, the switch 385 is closed according to a control from the state machine 310, and the output of the read logic circuit is provided to the write logic circuit 270. During the built-in-testing, the SERDES converter 250 receives the output of the write logic circuit 270, deserializes the output of the write logic circuit 270 according to the timing information of the clock signal from the reconfigurable clock circuit 340, and provides the deserialized data to the memory core interface circuit 220. During the built-in-testing, the data comparator 390 compares the test data from the test data generator 330 and propagated test data from the memory core interface circuit 220. The data comparator 390 informs the state machine 310 on whether the test data matches the propagated test data.

In some embodiments, the built-in-test circuit of the datapath 300 is functional during a die-sort process for testing functionalities of different dies before deployment. Additionally or alternatively, the built-in-test circuit is functional in between usage (e.g., reading and writing) of the operation of the memory device 120 to accommodate any changes in characteristics of circuits due to degrade in transistors or other components in circuits of the datapath 300.

Advantageously, the built-in-test circuit of the datapath 300 enables automatically determining, for different operating frequencies, minimum operable voltages from a set of operable voltage levels of a supply voltage of the voltage supply circuit 204 without manual testing. Thus, the datapath 300 may operate in a power efficient manner for any given frequency according to the determined minimum operable voltages from the set of operable voltage levels. In one aspect, the state machine 310 includes a frequency detector, which is a means for determining a frequency of input data received at the I/O contacts 280 of the datapath 300. In addition, the state machine 310 may be a means for retrieving a corresponding minimum operable voltage level associated with the frequency of the input data. In addition, the state machine 310 may be a means for causing the voltage supply circuit 204 to supply, to the datapath, the power supply voltage at the retrieved minimum operable voltage level. Hence, when the memory device 120 is in use, the state machine 310 determines a frequency of data at the I/O contacts 280 during read/write operations, and configures the voltage supply circuit 204 to supply the supply voltage at a minimum operable voltage corresponding to the determined frequency. The state machine 310 may determine the minimum operable voltage for the determined frequency based on the look up table stored by the storage 396.

Figure 4:
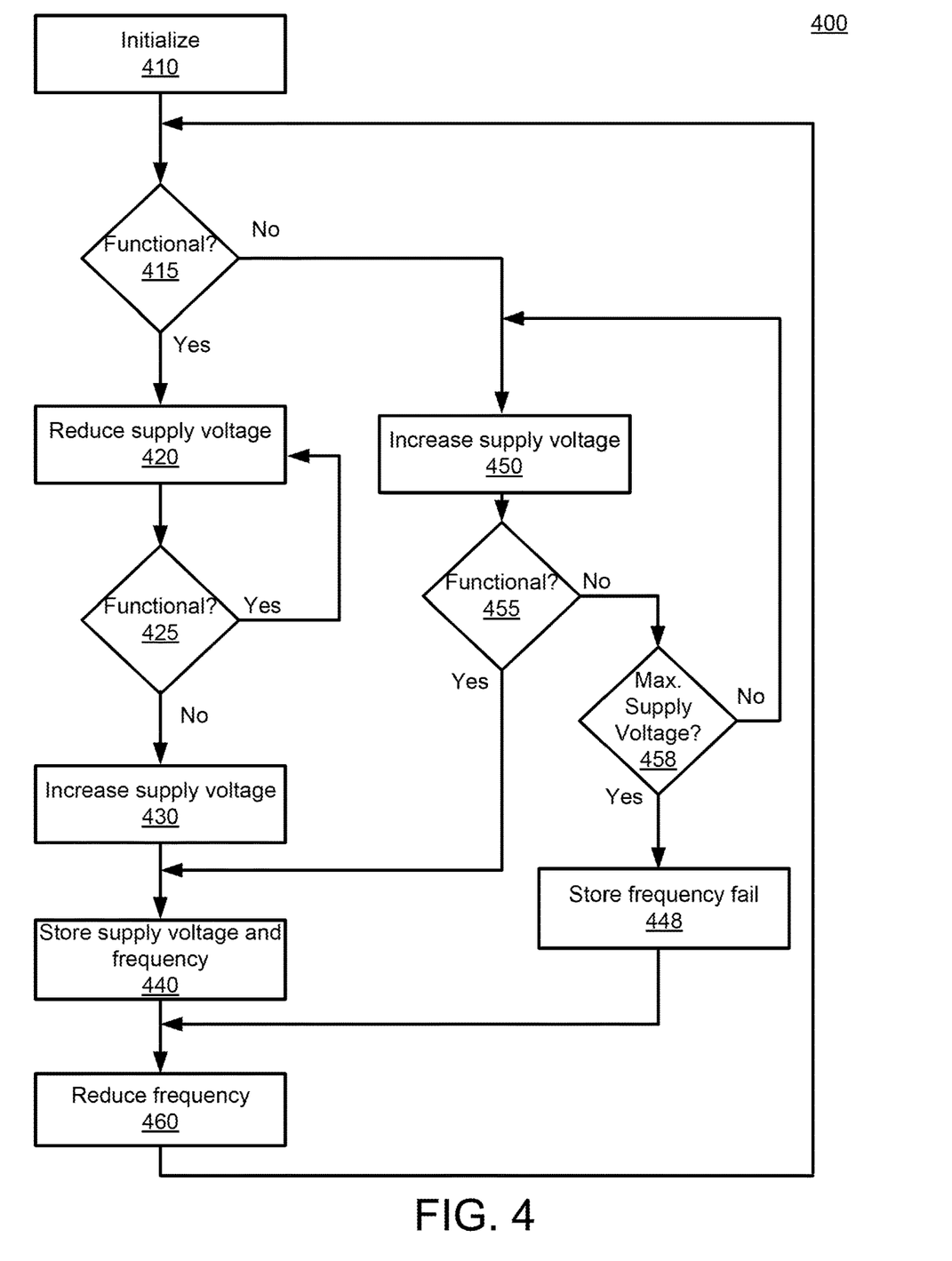
FIG. 4 is a flow chart illustrating a process of performing built-in-testing according to an example embodiment.

Referring to FIG. 4, illustrated is a flow chart illustrating a process 400 of performing built-in-testing, according to an example embodiment. In one embodiment, the process 400 is performed by the state machine 310 of FIG. 3B. In other embodiments, the process 400 may be performed by other entities. In other embodiments, the process 400 includes more, fewer, or different steps than shown in FIG. 4.

The state machine 310 initializes to set a supply voltage level of the voltage supply circuit 204 and a frequency of the reconfigurable clock circuit 340 at default values in step 410. In one approach, the state machine 310 selects the supply voltage level to a maximum voltage level from a set of operable voltage levels (e.g., 0.8V, 0.9V, 1.0V, 1.1V, 1.2V, etc.) of the supply voltage of the voltage supply circuit 204. The state machine 310 may set the frequency of the reconfigurable clock circuit 340 at a highest frequency from a set of operable frequencies (e.g., 533 MHz, 800 MHz, 1.066 GHz, etc.) of the reconfigurable clock circuit 340. In other embodiments, the state machine 310 chooses other values as default values.

The state machine 310 determines whether the datapath 300 is functional with a supply voltage level of the voltage supply circuit 204 at a selected frequency of the reconfigurable clock circuit 340 in step 415. The state machine 310 may configure the test data generator 330 to generate test data and compare the test data and propagated test data through the datapath 300 as described above with respect to FIG. 3B. If the test data from the test data generator 330 and propagated test data from the memory core interface circuit 220 matches, the state machine 310 determines that the datapath 300 is functional with the supply voltage level at the selected frequency. If the test data from the test data generator 330 and propagated test data from the memory core interface circuit 220 do no match, the state machine 310 determines that the datapath 300 is not functional with the supply voltage level at the selected frequency.

If the datapath 300 is functional with the supply voltage at the selected frequency at step 415, the state machine 310 causes the voltage supply circuit 204 to reduce the supply voltage to a next lower level in step 420, and determines whether the datapath 300 is functional with the new supply voltage level at the selected frequency in step 425. The state machine 310 repeats the steps 420 and 425, until the datapath 300 is not functional. If the datapath 300 is functional for all voltage levels of the voltage supply circuit 204 at the selected frequency at the step 425, the state machine 310 may store the lowest voltage level from the set of operable voltage levels of the voltage supply circuit 204 for the selected frequency, and test the datapath 300 for a different frequency (e.g., a next higher frequency or a next lower frequency) of the reconfigurable clock circuit 340. If the datapath 300 becomes not functional at the steps 420 and 425, the state machine 310 causes the voltage supply circuit 204 to increase the supply voltage to a next higher voltage level in step 430, and stores the supply voltage level as the minimum operable voltage level from the level of voltage levels of the voltage supply circuit 204 for the selected frequency at the storage 396 in step 440.

The state machine 310 may cause the reconfigurable clock circuit 340 to reduce its frequency to a next lower frequency from a set of operating frequencies of the reconfigurable clock circuit 340 in step 460, and proceeds to the step 415 to test the datapath 300 at a lower frequency. By proceeding to the step 415 after reducing the frequency of the reconfigurable clock circuit 340 without changing the voltage level, the datapath 300 can be tested with the minimum operable voltage level, at which the datapath 300 was operable with a previous frequency rather with a default voltage level (e.g., maximum voltage level of the set of operable voltage levels of the voltage supply circuit 204). Hence, a number of tests performed and an amount of time to determine the minimum operable voltage level for the new frequency may be reduced.

If the datapath 300 is not functional with the supply voltage at the selected frequency at step 415, the state machine 310 causes the voltage supply circuit 204 to increase the supply voltage to a next higher level in step 450, and determines whether the datapath 300 is functional with the new supply voltage level at the selected frequency in step 455. If the datapath 300 is functional at the step 455, the state machine 310 proceeds to the step 440 to store the supply voltage level as the minimum operable voltage level from the level of voltage levels of the voltage supply circuit 204 for the selected frequency at the storage 396. If the datapath is not functional at the step 455, the datapath 300 determines whether a maximum supply voltage level from the set of operable voltage levels of the voltage supply circuit 204 is reached in step 458. If the maximum supply voltage level has not reached, the state machine 310 repeats the steps 450 and 455, until the datapath 300 becomes functional or until the maximum supply voltage level from the set of operable voltage levels of the voltage supply circuit 204 is reached. If the maximum supply voltage level is reached at step 458, the state machine 310 may record in the storage 396 that the datapath 300 is inoperable for that particular frequency even at the maximum supply voltage in the step 448 and proceed to the step 460.

Figure 5:
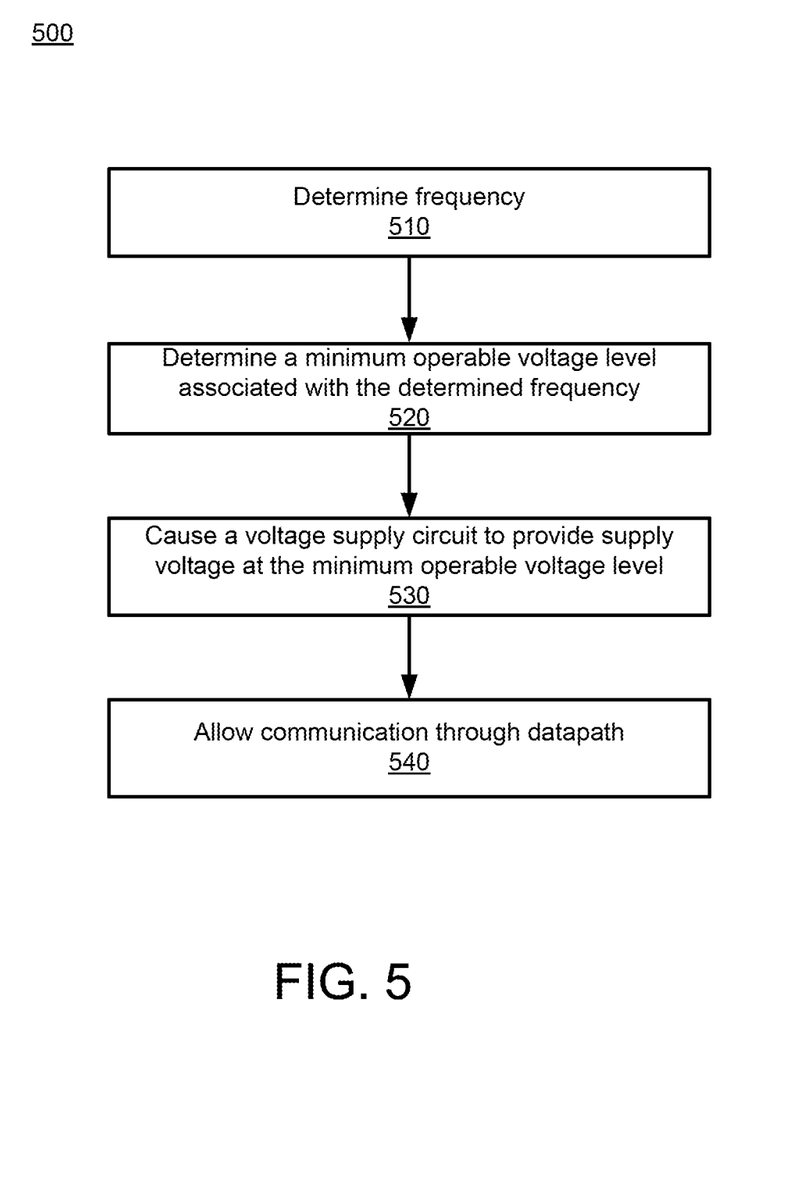
FIG. 5 is a flow chart illustrating a process of operating a datapath according to an example embodiment.

FIG. 5 is a flow chart illustrating a process 500 of operating a datapath 300 according to an example embodiment. The process 500 may be performed by the state machine 310 of FIG. 3B. In other embodiments, the process 500 may be performed by other entities. In other embodiments, the process 500 includes more, fewer, or different steps than shown in FIG. 5.

The state machine 310 automatically determines a frequency of input data at the I/O contacts 280 in step 510. In one aspect, the state machine 310 includes a frequency detector coupled to the I/O contacts 280 that detects a frequency of a signal at the I/O contacts 280. The frequency of the input data from the memory controller 126 may dynamically vary during the operation of the device. For example, the memory controller 126 may output data at any one of set of frequencies (e.g., 533 MHz, 800 MHz, 1.066 GHz, etc.) depending on requirements such as power, bandwidth, latency, etc. The frequency detector of the state machine 310 can automatically detect the frequency of the input data (and any changes in that frequency) to automatically find a corresponding minimum operable voltage. Alternatively, the memory controller 126 may transmit information describing the frequency of signal transmitted to the state machine 310, and the state machine 310 can determine the frequency of the signal based on the information from the memory controller 126.

The state machine 310 automatically determines a minimum operable voltage level associated with the determined frequency in step 520. The state machine 310 may refer to the look up table stored by the storage 396 to determine the minimum operable voltage associated with the determined frequency.

The state machine 310 causes the voltage supply circuit 204 to provide a supply voltage at the minimum operable voltage level to the circuitries of the datapath 300 in step 530. In addition, the state machine 310 allows communication through the datapath 300, while the voltage supply circuit 204 provides the supply voltage at the minimum operable voltage level. Accordingly, the datapath 300 can operate in a power efficient manner for the incoming data at the determined frequency.

Although FIG. 5 is described with respect to a memory write operation, similar process of determining a minimum operable voltage level for a given frequency of the datapath 300 may be performed for a memory read operation. In particular, for a selected frequency of the datapath, the state machine 310 can determine a corresponding minimum operable voltage level from the storage 396, and cause the voltage supply circuit 204 to provide a supply voltage at the determined minimum operable voltage level to the components of the datapath 300. Hence, the memory read operation can be performed in a power efficient manner for any frequency.

The preceding description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising:
   a datapath to transfer data between a memory core and an IQ interface, the datapath including a plurality of circuits, and a memory core interface, the plurality of circuits operating according to a supply voltage: and
   a test circuit coupled to the datapath, the test circuit configured to determine, from a set of operable voltage levels supported by the supply voltage, a first minimum operable voltage level for the datapath to operate for data traversing the datapath at a first frequency,
   wherein the test circuit comprises:
      a state machine configured to: select a frequency from a set of frequencies,
      select a voltage level from the set of operable voltage levels, and
      configure a voltage supply circuit to generate the supply voltage at the selected voltage level,
   a reconfigurable clock circuit coupled to the state machine, the reconfigurable clock circuit configured to generate a clock signal at the selected frequency,
   a test data generator coupled to the state machine, the test data generator configured to propagate test data through the datapath according to the clock signal, and
   a comparator coupled to the state machine and the test data generator, the comparator configured to:
      receive the test data from the test data generator,
      receive the propagated test data from the datapath, and
      compare the test data from the test data generator and the propagated test data from the datapath to determine whether the datapath is operable at the selected frequency for the selected voltage level.

2. The apparatus of claim 1, wherein the test data is random data.

3. The apparatus of claim 1, wherein the comparator is configured to:
   determine that the datapath is inoperable at the selected frequency for the selected voltage level, in response to determining that the test data from the test data generator and the propagated test data from the datapath are not matching, and
   determine that the datapath is operable at the selected frequency for the selected voltage level, in response to determining that the test data from the test data generator and the propagated test data from the datapath are matching.

4. The apparatus of claim 1, wherein, in response to determining that the datapath is inoperable at the selected frequency for the selected voltage level, the state machine is configured to:
   select another voltage level higher than the selected voltage level, and configure the voltage supply circuit to generate the supply voltage at the another voltage level, and
   wherein the comparator is configured to determine whether the datapath is operable at the selected frequency for the another voltage level.

5. The apparatus of claim 4, wherein, in response to determining that the datapath is operable at the selected frequency for the another voltage level, the state machine is configured to determine that the another voltage level is a minimum operable voltage level for the datapath to operate for the data traversing the datapath at the selected frequency.

6. The apparatus of claim 1, wherein, in response to determining that the datapath is operable at the selected frequency for the selected voltage level, the state machine is configured to:
   select another voltage level lower than the selected voltage level, and
   configure the voltage supply circuit to generate the supply voltage at the another voltage level, and
   wherein the comparator is configured to determine whether the datapath is operable at the selected frequency for the another voltage level.

7. The apparatus of claim 6, wherein, in response to determining that the datapath is inoperable at the selected frequency for the another voltage level, the state machine is configured to determine that the selected voltage level is a minimum operable voltage level, at which the datapath is operable for the data traversing the datapath at the selected frequency.

* * * * *